United States Patent
Sun et al.

(10) Patent No.: US 12,259,657 B2
(45) Date of Patent: Mar. 25, 2025

(54) LITHOGRAPHY SYSTEM AND METHOD OF DETECTING FLUID LEAKAGE IN LIQUID STORAGE TANK OF THE SAME

(71) Applicant: United Microelectronics Corp., Hsinchu (TW)

(72) Inventors: Zhi Fan Sun, Kaohsiung (TW); Kuo Feng Huang, Tainan (TW); Ming Hsien Chung, Tainan (TW); Hua-Wei Peng, Hsinchu County (TW); Chih Chung Kuo, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 202 days.

(21) Appl. No.: 18/306,995

(22) Filed: Apr. 25, 2023

(65) Prior Publication Data

US 2024/0319611 A1    Sep. 26, 2024

(30) Foreign Application Priority Data

Mar. 21, 2023 (TW) .................................. 112110390

(51) Int. Cl.
*G03F 7/00* (2006.01)
*G01F 23/14* (2006.01)

(52) U.S. Cl.
CPC .......... *G03F 7/70341* (2013.01); *G01F 23/14* (2013.01); *G03F 7/70525* (2013.01)

(58) Field of Classification Search
CPC ... G01F 23/14; G03F 7/70341; G03F 7/70525
See application file for complete search history.

(56) References Cited

U.S. PATENT DOCUMENTS

| | | | |
|---|---|---|---|
| 7,602,471 B2* | 10/2009 | Fu ....................... | G03F 7/70341 355/30 |
| 9,285,686 B2 | 3/2016 | Mertens et al. | |
| 9,575,406 B2* | 2/2017 | Van Der Gaag .... | G03F 7/70341 |
| 10,248,033 B2 | 4/2019 | Mertens et al. | |
| 2004/0118184 A1* | 6/2004 | Violette ............. | G03F 7/70341 73/37.5 |
| 2005/0282405 A1* | 12/2005 | Harpham ............ | G03F 7/70841 438/795 |
| 2010/0007862 A1* | 1/2010 | Arai ..................... | G03F 7/70925 355/75 |
| 2010/0290013 A1* | 11/2010 | De Metsenaere ...... | G03B 27/52 355/30 |
| 2012/0012191 A1* | 1/2012 | Hoshino ............. | G03F 7/70341 137/154 |
| 2018/0181004 A1* | 6/2018 | Saeed ................... | G03F 7/7065 |

* cited by examiner

*Primary Examiner* — Deoram Persaud
(74) *Attorney, Agent, or Firm* — JCIPRNET

(57) ABSTRACT

A lithography system includes an immersion lithographic apparatus, a fluid supply device, and a sensor. The fluid supply is configured to supply fluid to the immersion lithographic apparatus. The fluid supply device includes at least one liquid storage tank, an upper liquid pipe and a lower liquid pipe connected to the liquid storage tank. The sensor includes at least one hydraulic pressure gauge. The at least one hydraulic pressure gauge is arranged near a lower part of the liquid storage tank and connected to the lower liquid pipe and the upper liquid pipe so as to measure the hydraulic pressure at a bottom of the liquid storage tank. The height of the liquid level in the liquid storage tank is calculated from the hydraulic pressure.

14 Claims, 7 Drawing Sheets

LITHOGRAPHY SYSTEM AND METHOD OF DETECTING FLUID LEAKAGE IN LIQUID STORAGE TANK OF THE SAME

CROSS-REFERENCE TO RELATED APPLICATION

This application claims the priority benefit of Taiwan application serial no. 112110390, filed on Mar. 21, 2023. The entirety of the above-mentioned patent application is hereby incorporated by reference herein and made a part of this specification.

BACKGROUND

Technical Field

The embodiments of the present disclosure relate to a semiconductor system and a method of detecting the same, and particularly relate to a lithography system and a method of detecting fluid leakage in a fluid storage tank of the same.

Description of Related Art

As the device size continues to shrink, the lithography process has a great impact on critical dimensions. The immersion (wet) lithography technology uses water as a medium between an objective lens and a wafer substrate. Through the principle of light refraction, the original wavelength is changed to produce a smaller wavelength. The smaller wavelength allows for a higher resolution and therefore a smaller circuit. Accordingly, the management of a water supply device is very important. When liquid leaks and is unable to supply in time, the process is delayed or interrupted, and the production capacity is therefore affected.

SUMMARY

The embodiment of the present disclosure provides a lithography system capable of detecting and obtaining the height of a liquid level of a fluid supply device in real time, so as to determine whether there is a liquid leakage.

An embodiment of the present disclosure provides a lithography system including an immersion lithographic apparatus, a fluid supply device, and a sensor. The fluid supply is configured to supply fluid to the immersion lithographic apparatus. The fluid supply device includes at least one liquid storage tank, an upper liquid pipe and a lower liquid pipe connected to the liquid storage tank. The sensor includes at least one hydraulic pressure gauge. The at least one hydraulic pressure gauge is arranged near a lower part of the liquid storage tank and connected to the lower liquid pipe and the upper liquid pipe so as to measure the hydraulic pressure at a bottom of the liquid storage tank. The height of the liquid level in the liquid storage tank is calculated from the hydraulic pressure.

An embodiment of the present disclosure provides a method for detecting liquid leakage in a liquid storage tank of a lithography system, wherein the lithography system includes an immersion lithographic apparatus, a fluid supply device, and a sensor. The fluid supply device is configured to supply liquid to the immersion lithographic apparatus, and includes at least one liquid storage tank, an upper liquid pipe and a lower liquid pipe connected to the liquid storage tank. The sensor includes at least one hydraulic pressure gauge, wherein the at least one hydraulic pressure gauge is arranged near a lower part of the liquid storage tank, and connected to the lower liquid pipe and the upper liquid pipe. The method includes measuring a hydraulic pressure at a bottom of the liquid storage tank of the liquid supply device with the hydraulic pressure gauge, wherein the liquid supply device is configured to supply liquid to the immersion lithographic apparatus; and calculating a height of a liquid level from the hydraulic pressure at the bottom of the liquid storage tank.

The liquid supply device includes a liquid storage tank, an upper liquid pipe and a lower liquid pipe connecting the liquid storage tank, and a hydraulic pressure gauge. The liquid supply device is arranged near the lower part of the liquid storage tank, and connects the lower liquid pipe and the upper liquid pipe. The liquid leakage detection method includes: measuring the bottom hydraulic pressure of the liquid storage tank of the liquid supply device with a hydraulic pressure gauge, wherein the liquid supply device supplies liquid to the immersion lithographic apparatus, and the liquid level is calculated from the hydraulic pressure at the bottom of the liquid storage tank.

The fluid supply device of a lithography system of the embodiment of the present disclosure includes a hydraulic pressure gauge, and the height of a liquid level can be calculated from the pressure measured by the hydraulic pressure gauge, so as to in-situ detect whether there is a liquid leakage.

DESCRIPTION OF THE EMBODIMENTS

Figure 1:
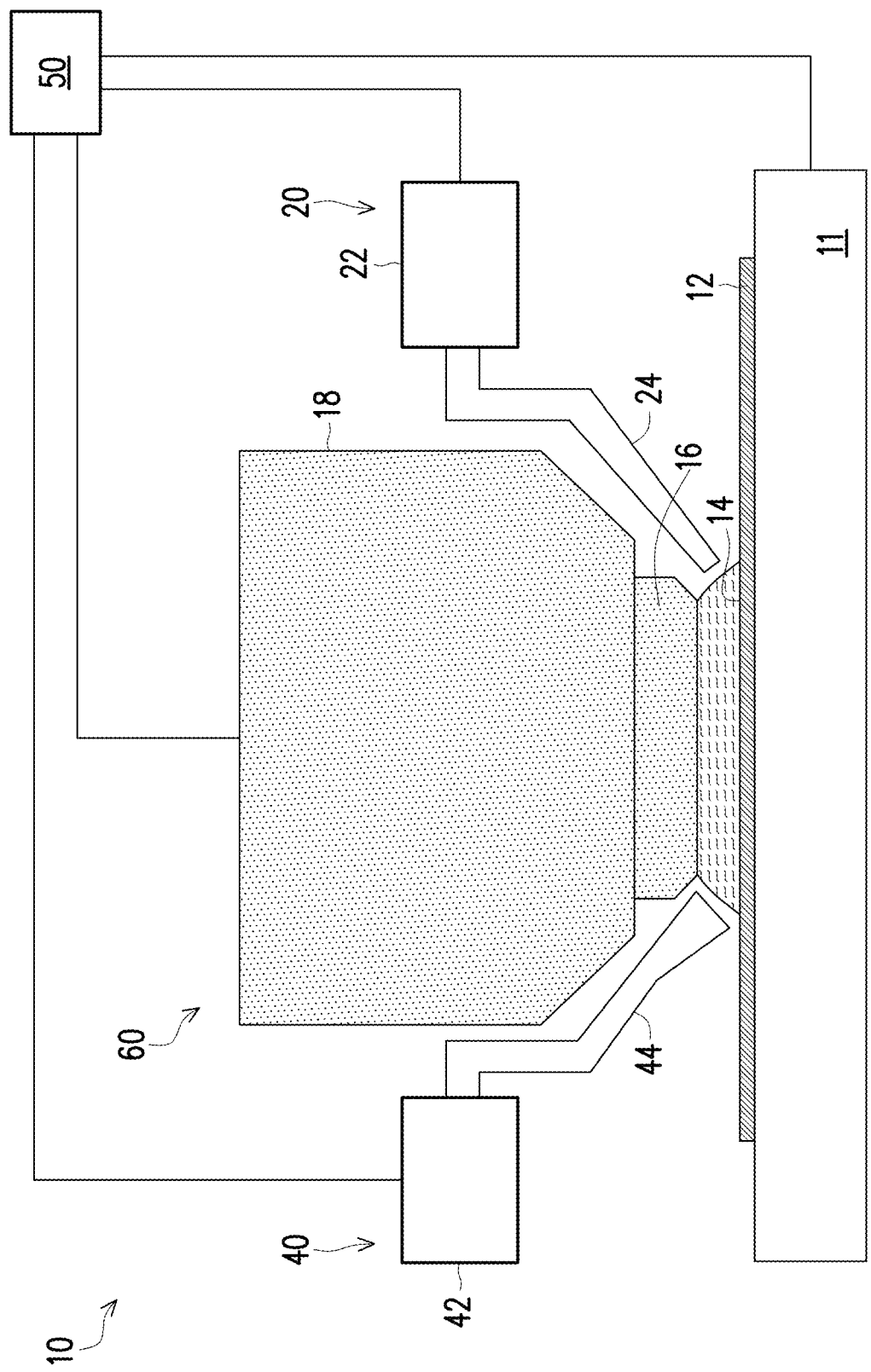
FIG. 1 is a schematic diagram of a lithography system according to an embodiment of the present disclosure.

FIG. 1 is a schematic diagram of a lithography system according to an embodiment of the present disclosure.

Referring to FIG. 1, a lithography system 10 includes an immersion lithographic apparatus 60 and a fluid supply device 20. The immersion lithographic apparatus 60 includes a wafer carrier 11, an immersion fluid (or called "liquid") 14, and a light projection device 18. The wafer stage 11 can be configure to carry and hold a wafer 12 coated with photoresist. The end of the light projection device 18 has an objective lens component 16. The immersion fluid 14 exists and occupies the space between the top surface of the photoresist-coated wafer 12 and the top surface of the objective lens component 16.

The immersion fluid 14 is a liquid with a refractive index greater than 1. The immersion fluid 14 may include water, an aqueous solution, a non-aqueous liquid, a non-aqueous solution, or a mixture thereof. The non-aqueous liquid may include an organic solvent. The non-aqueous solution may include an organic solution.

The light projection system 18 can be configured to pass actinic radiation required for exposure through the objective lens component 16 and the immersion fluid 14 to the photoresist-coated wafer 12. The light projection system 18 may include the objective lens component 16 as well as other multiple lens components. The objective lens component 16 may be in contact with the immersion fluid 14 on the top surface of the photoresist-coated wafer 12.

The immersion fluid 14 may be delivered to the space between the objective lens component 16 and the photoresist-coated wafer 12 through the arrangement of the fluid supply device 20. The fluid supply device 20 may include a fluid storage tank 22 and a fluid supply line 24. The liquid storage tank 22 is configured to store fresh and unused immersion fluid 14. The fresh and unused immersion fluid 14 in the liquid storage tank 22 may be provided through the liquid supply line 24 below the objective lens component 16 and above the photoresist-coated wafer 12. An upper limit value and a lower limit value are set for the storage volume of the immersion fluid 14 in the liquid storage tank 22. When the storage volume is lower than the lower limit value, the storage volume of the immersion fluid 14 is too low and should be replenished. When the upper limit value is exceeded, the immersion fluid 14 is oversupplied. Therefore, for the normal operation of the system, the storage volume of the immersion fluid 14 is usually controlled between the upper limit value and the lower limit value.

In some embodiments, the lithography system 10 further includes a fluid recovery device 40. After the exposure, the fluid recovery device 40 may be configured to recover the immersion fluid 14 between the objective lens component 16 and the photoresist-coated wafer 12. The fluid recovery device 40 may include a liquid storage tank 42 and a liquid recovery line 44. The liquid recovery line 44 is configured to recover the used immersion fluid 14 into the liquid storage tank 42.

The system controller 50 can monitor and control the movement and position of the wafer stage 11. The system controller 50 may control the light projection system 18 and may control the exposure of light radiation to the photoresist-coated wafer 12. The system controller 50 can monitor the dispensing and recovery of the immersion fluid 14 in the fluid supply device 20 and the fluid recovery device 40.

Figure 2:
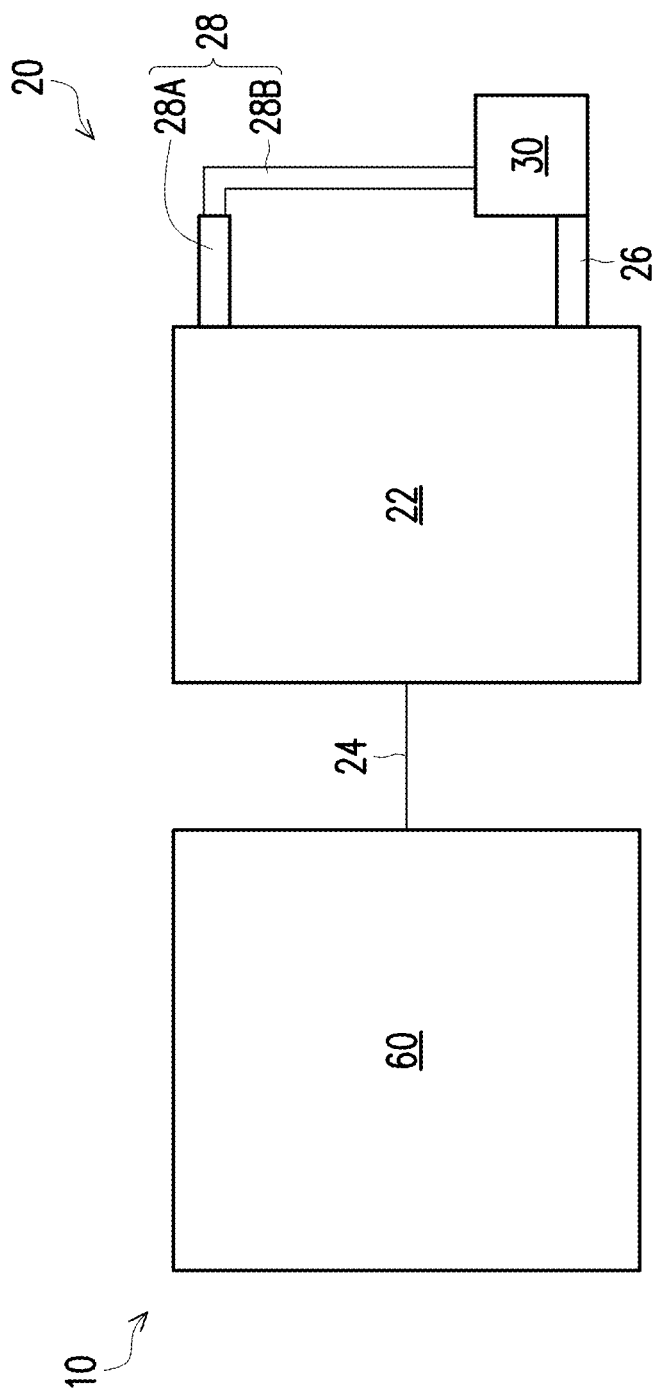
FIG. 2 is a schematic diagram of a fluid supply device with a sensor in a lithography system according to an embodiment of the present disclosure.

FIG. 2 is a schematic diagram of a fluid supply device with a sensor in a lithography system according to an embodiment of the present disclosure.

Referring to FIG. 2, the fluid supply device 20 of the embodiment of the present disclosure further includes a lower liquid pipe 26, an upper liquid pipe 28 and a sensor 30 in addition to the liquid storage tank 22 and the liquid supply line 24. The lower liquid pipe 26 and the upper liquid pipe 28 are connected to the liquid storage tank 22 and the sensor 30. The sensor 30 includes a hydraulic pressure gauge (or called "hydraulic gauge"). For clarity, the sensor 30 is also referred to as the hydraulic pressure gauge 30 hereinafter.

Referring to FIG. 2, the upper liquid pipe 28 is disposed near the upper part of the liquid storage tank 22. The upper liquid pipe 28 may be in (fluid) communication with the upper part of the liquid storage tank 22 from the upper sidewall of the liquid storage tank 22. In some embodiments, the upper liquid pipe 28 may include a fixed tube 28A and a hose 28B. The fixed tube 28A may be fixed to the upper side wall of the liquid storage tank 22 and in communication with the upper part of the liquid storage tank 22. The hose 28B is connected to the fixed tube 28A and the hydraulic pressure gauge 30. The lower liquid pipe 26 is disposed near the lower part of the liquid storage tank 22. The lower liquid pipe 26 may be in communication with the lower part of the liquid storage tank 22 from the lower sidewall of the liquid storage tank 22.

The hydraulic pressure gauge 30 is provided near the lower part of the liquid storage tank 22. The hydraulic pressure gauge 30 is connected to the lower part of the liquid storage tank 22 through the lower liquid pipe 26 and connected to the upper part of the liquid storage tank 22 through the upper liquid pipe 28. The lower liquid pipe 26 can serve as a reference point for hydraulic pressure measurement. Therefore, the pressure of the immersion fluid 14 in the lower liquid pipe 26 is substantially the same as the pressure of the immersion fluid 14 at the bottom of the liquid storage tank 22. The hydraulic pressure gauge 30 may include a micro-pressure hydraulic gauge.

The hydraulic pressure gauge 30 can measure the hydraulic pressure generated based on the hydraulic height of the immersion fluid 14 in the liquid storage tank 22 relative to the bottom of the liquid storage tank 22 (approximately where the lower liquid pipe 26 is located). According to the following equation (1), the height h of the immersion fluid 14 in the liquid storage tank 22 can be obtained according to the measured hydraulic pressure P.

$$P = \rho g h \quad (1),$$

wherein ρ is the density of the immersion fluid 14, and g is the gravitational acceleration.

According to the height h of the immersion fluid 14 in the liquid storage tank 22 obtained every period of time t, the change of height h with time t can be recorded. Therefore, from the recorded graph of height h versus time t, the consumption of the immersion fluid 14 can be obtained as time t passes. The time t can be recorded by hours or days. Generally, the time t can be recorded by days. Generally speaking, under the normal operation of the system, the immersion fluid 14 in the liquid storage tank 22 may consume a certain amount; for example, the liquid may drop to a predetermined height every few days. Therefore, when the liquid exceeds the predetermined height within a short period of time, it is judged that a water leakage may occur. At this point, the system person can stop the supply of the immersion fluid 14 and check the system for leakage. After the leakage problem is solved, the immersion fluid 14 is re-supplied.

Figure 3:
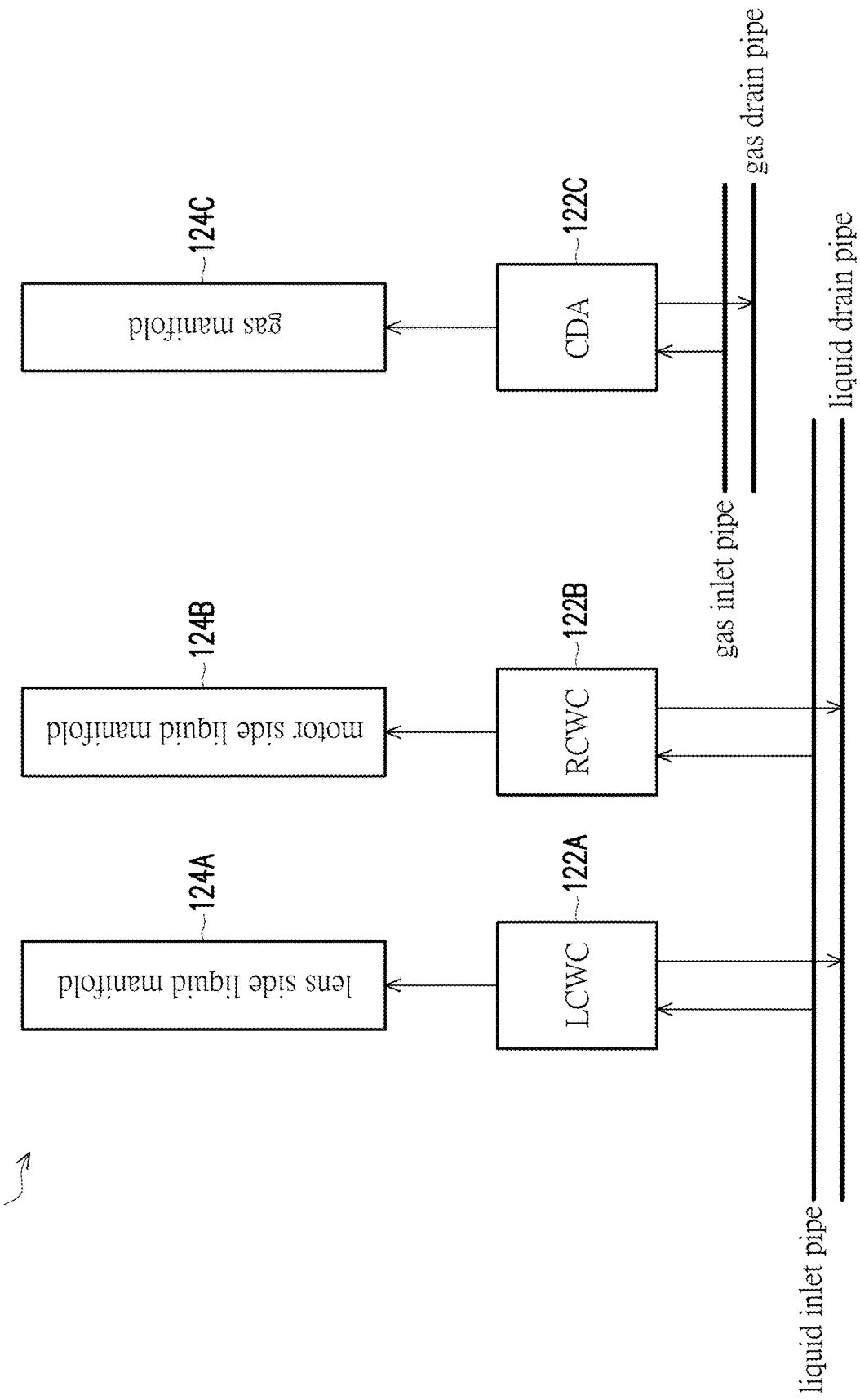
FIG. 3 is a schematic diagram of a fluid supply device according to an embodiment of the present disclosure.

FIG. 3 is a schematic diagram of a fluid supply device according to an embodiment of the present disclosure.

Referring to FIG. 1 and FIG. 3, the fluid supply device 20 can supply liquid or gas. The liquid may be the aforementioned immersion fluid 14 provided to the space between the objective lens component 16 and the photoresist-coated wafer 12. The liquid may also be a liquid supplied to a motor of the lithography system 10. In some examples, the fluid supply 20 includes a lens liquid storage tank (LCWC) 122A, a motor fluid storage tank (RCWC) 122B, and a clean dry air storage tank (CDA) 122C. The liquid can be delivered to the lens liquid storage tank (LCWC) 122A and the motor liquid storage tank (RCWC) 122B through a liquid inlet pipe. When the liquid in the lens liquid storage tank (LCWC) 122A and the motor liquid storage tank (RCWC) 122B is excessive, it can be discharged through a liquid drain pipe. The gas may be delivered to a clean dry air storage tank (CDA) 122C through an inlet pipe. When the gas in the clean dry air storage tank (CDA) 122C is excessive, it can be exhausted through a drain pipe. The lens liquid storage tank 122A is configured to supply liquid between the wafer and the lens through a lens side liquid manifold 124A. The motor fluid storage tank 122B is configured to supply fluid to the motor through a motor side liquid manifold 124B. The clean dry air storage tank 122C is configured to supply dry air to the wafer through an air side manifold 124C.

Figure 4A:
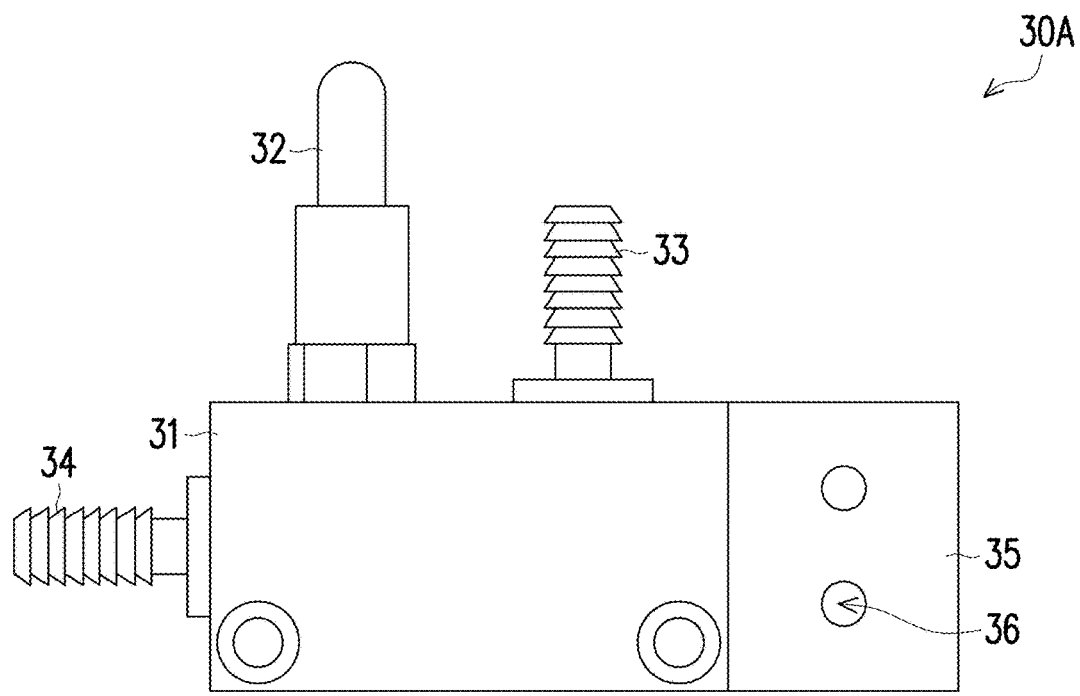
FIG. 4A illustrates a cross-sectional view of a practical example of a hydraulic pressure gauge module.
Figure 4B:
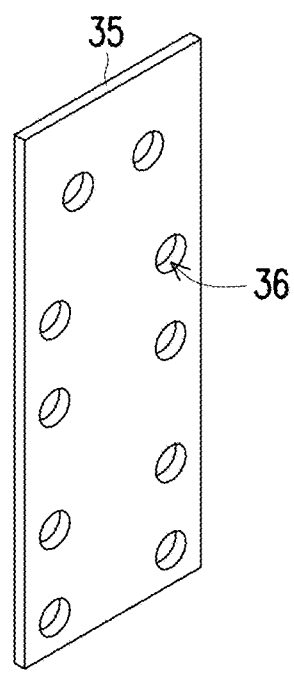
FIG. 4B illustrates a perspective view of a practical example of an adjustment plate of a hydraulic pressure gauge module.

FIG. 4A illustrates a cross-sectional view of a practical example of a hydraulic pressure gauge module. FIG. 4B illustrates a perspective view of a practical example of an adjustment plate of a hydraulic pressure gauge module.

Referring to FIG. 4A, the hydraulic pressure gauge module 30A includes a manifold block 31, a micro-pressure sensor 32, a first hose connector 33, a second hose connector 34 and an adjustment plate 35. The manifold block 31 may be mounted on the adjustment plate 35. The micro-pressure sensor 32, the first hose connector 33 and the second hose connector 34 are arranged at appropriate positions of the manifold block 31. The first hose joint 33 and the second hose joint 34 are respectively connected to the upper liquid pipe 28 and the lower liquid pipe 26 (shown in FIG. 2).

Referring to FIG. 2 and FIG. 4A and FIG. 4B, the hydraulic pressure gauge module 30A can be installed at a proper position on the fluid supply device 20 through the adjustment plate 35. In addition, multiple installation holes 36 may be provided on the adjustment plate 35. By selecting proper installation holes 36 and the corresponding screws, the hydraulic pressure gauge module 30A can be mounted on the fluid supply device 20 in an adjustable manner. In this way, the present disclosure can provide a hydraulic pressure gauge module 30A with simple structure and easy installation.

According to the above-described embodiment, a simple hydraulic pressure gauge is configured to monitor the consumption of the immersion fluid 14. As compared with the conventional differential pressure gauge, the hydraulic pressure gauge is relatively cheap. Therefore, the embodiment of the present disclosure can monitor whether there is a fluid leakage problem in the system in an economic and effective manner.

Figure 5:
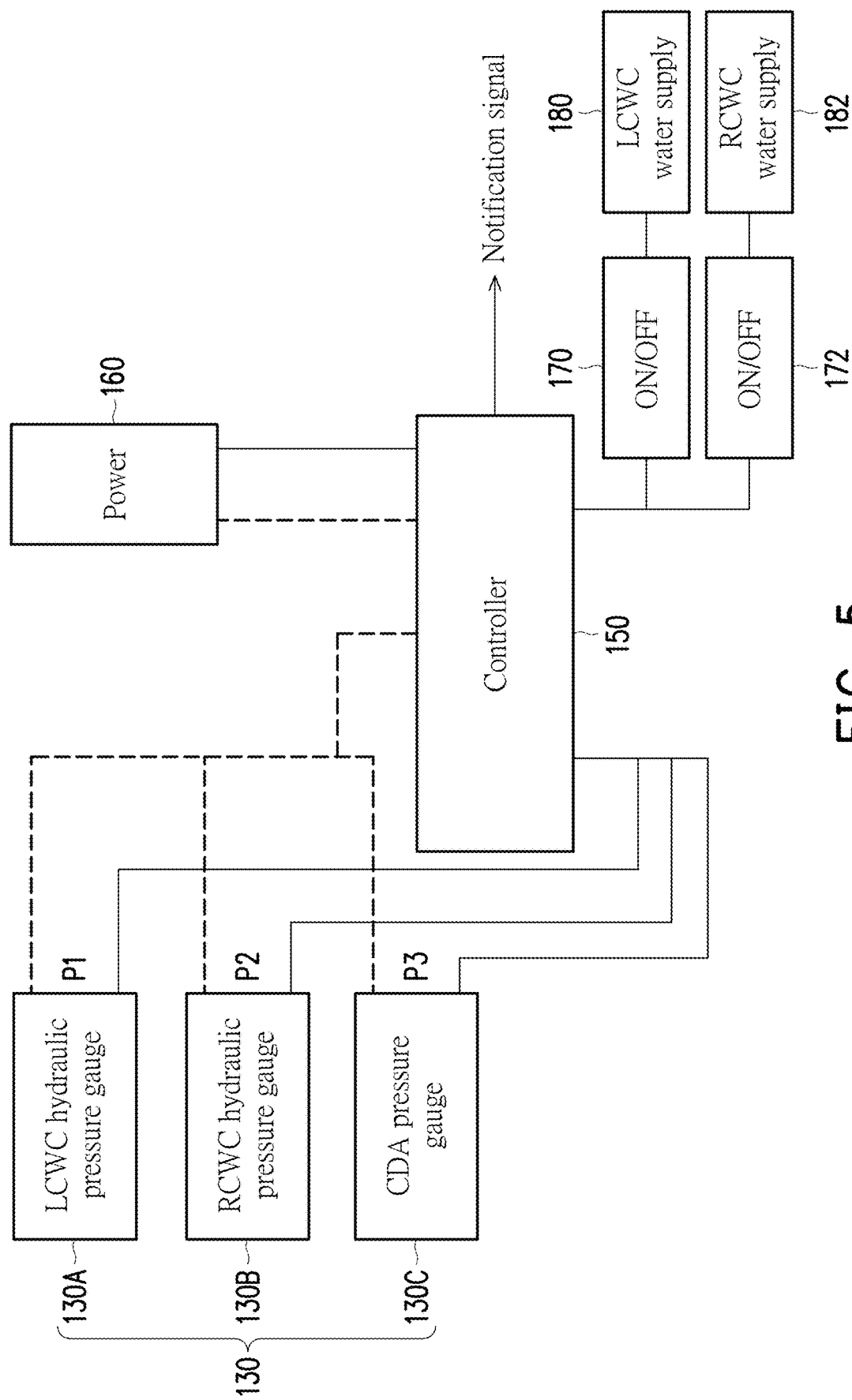
FIG. 5 is a control circuit diagram of hydraulic pressure gauges according to an embodiment of the present disclosure.

FIG. 5 is a control circuit diagram of hydraulic pressure gauges according to an embodiment of the present disclosure. In the example shown in FIG. 5, three fluid supply devices 20 are provided in the lithography system, which include a lens fluid storage tank, a motor fluid storage tank, and a clean dry air storage tank. The sensing module 130 of the lithography system may include a lens liquid storage tank (LCWC) hydraulic pressure gauge 130A, a motor liquid storage tank (RCWC) hydraulic pressure gauge 130B, and a clean dry air storage tank (CDA) pressure gauge 130C to monitor whether there is a liquid leakage or a gas leakage in the lens liquid storage tank, the motor liquid storage tank and the clean dry air storage tank, respectively.

The lens liquid storage tank (LCWC) hydraulic pressure gauge 130A and the motor liquid storage tank (RCWC) hydraulic pressure gauge 130B respectively sense hydraulic pressures in the lens liquid storage tank and the motor liquid storage tank and output the hydraulic pressures P1, P2. The clean dry air storage tank (CDA) pressure gauge 130C senses an air pressure in the clean dry air storage tank and outputs the air pressure P3. In addition, the sensing module 130 (including 130A, 130B, and 130C) can be set to continuously sense and output the hydraulic pressures in the lens liquid storage tank and the motor liquid storage tank at regular intervals.

The control circuit includes a controller 150, and the controller 150 may be a Raspberry processor, a programmable logic controller, or a suitable processor. The controller 150 may be powered by a power 160. The controller 150 is configured to receive outputs P1, P2, P3 of three sensors (two hydraulic pressure gauges and one pressure gauge) 130A, 130B, 130C. The control circuit can be programmed to convert the hydraulic pressures P1 and P2 received in the lens liquid storage tank and the motor liquid storage tank into the height of a liquid level of each storage tank. In addition, as a feasible implementation, the lens liquid storage tank (LCWC) hydraulic pressure gauge 130A and the motor liquid storage tank (RCWC) hydraulic pressure gauge 130 can also be designed to convert the sensed hydraulic pressures P1 and P2 into corresponding heights of the liquid levels h1 and h2 are then input to the controller 150.

In addition, the controller 150 can be programmed to judge whether there is a liquid leakage in the lens liquid storage tank and the motor liquid storage tank. As mentioned above, when the liquid volume exceeds the predetermined height (e.g., normal consumption volume) in a short period of time, it is judged that a liquid leakage may occur. Alternatively, the amount of liquid drop per unit time can be set as a critical value, and when the critical value is exceeded, it is judged that a liquid leakage may occur.

When the controller 150 judges that there is a liquid leakage in the lens liquid storage tank and/or the motor liquid storage tank, it generates a control signal to the control valve 170 of the lens liquid supply tank 180 and/or the control valve 172 of the motor liquid supply tank 182. As a result, the control valves 170, 172 are closed to stop supplying liquid to the lens liquid storage tank and/or the motor liquid storage tank. The lens liquid storage tank and/or the motor liquid storage tank can be checked for leakage. After the liquid leakage problem is solved, the control valves 170 and 172 are opened again.

In addition, when the controller judges that there is a liquid leakage, it can also output a notification signal to the relevant operator, so that the operator can know the situation of liquid leakage in real time. Thereby, the operator can respond quickly.

In short, the controller 150 can also receive the hydraulic pressure measured by the hydraulic pressure gauge 30 and calculate the liquid level of the immersion fluid 14 in the liquid storage tank 22. In addition, when the liquid level of the immersion fluid 14 in the liquid storage tank 22 is lower than a predetermined value, the controller 150 can send a notification signal, or further stop supplying the immersion fluid 14 to the liquid storage tank 22, so as to check whether there is a leak liquid. Even, when the amount of liquid drop per unit time exceeds the critical value, the controller 50 can send a notification signal, or further stop supplying the immersion fluid 14 to the liquid storage tank 22, so as to check whether there is a liquid leakage.

Thus, the present disclosure can design a liquid leakage detection mechanism at a lower cost, by which the operator does not need to check the liquid level of the lens liquid storage tank and/or the motor liquid storage tank at any time, and the control unit 150 can timely notify the operator and turn off the liquid supply system to facilitate troubleshooting. In the embodiment of the present disclosure, a hydraulic pressure gauge (such as a micro-pressure hydraulic gauge) is installed in live-line, the immersion lithographic apparatus does not need to be shut down, and the production capacity is not affected.

Figure 6:
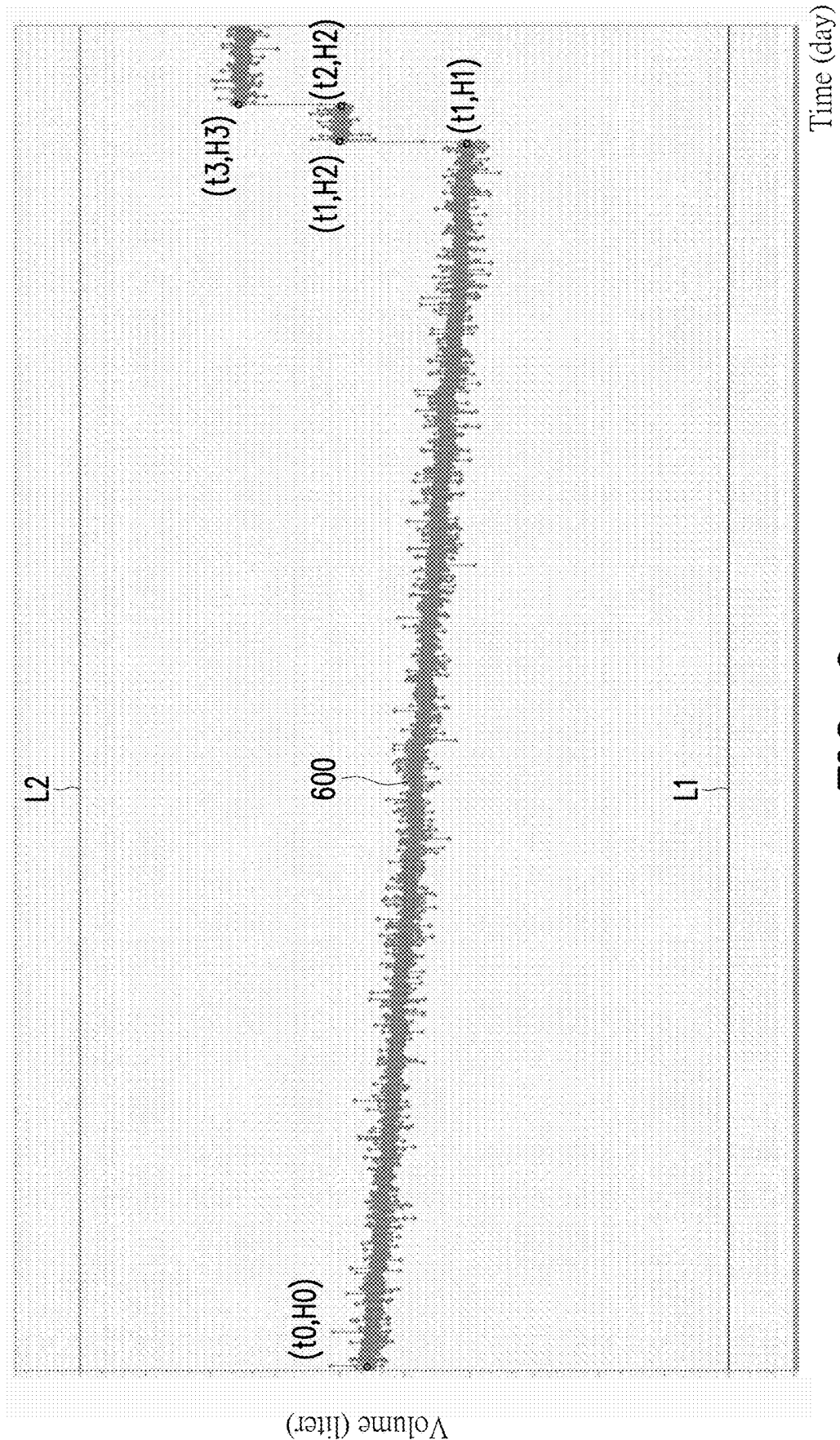
FIG. 6 illustrates a practical example of the change in liquid storage volume versus time in a liquid storage tank.

FIG. 6 illustrates a practical example of the change in liquid storage volume versus time in a liquid storage tank.

Referring to FIG. 6, a curve 600 shows the change in liquid storage volume as time passes. After a long period of time t1, the liquid level of the liquid in the liquid storage tank drops to H1. At time t1, the liquid storage volume in the liquid storage tank is still between the upper limit value L2 and the lower limit value L1. Besides, as compared with the height H0 at the initial time t0, the slight liquid drop in storage volume is within the normal range, indicating that there is no leakage from the liquid storage tank. Thus, the fluid can be replenished in the fluid storage tank according to normal maintenance. The liquid can be replenished at different time points. In this example, a first replenishment is performed at time t1 to increase the liquid level to H2. After a period of observation, the liquid level of the liquid is still maintained around H2 at time t2, and then a second replenishment can be performed to increase the liquid level to H3 at time t2.

Figure 7:
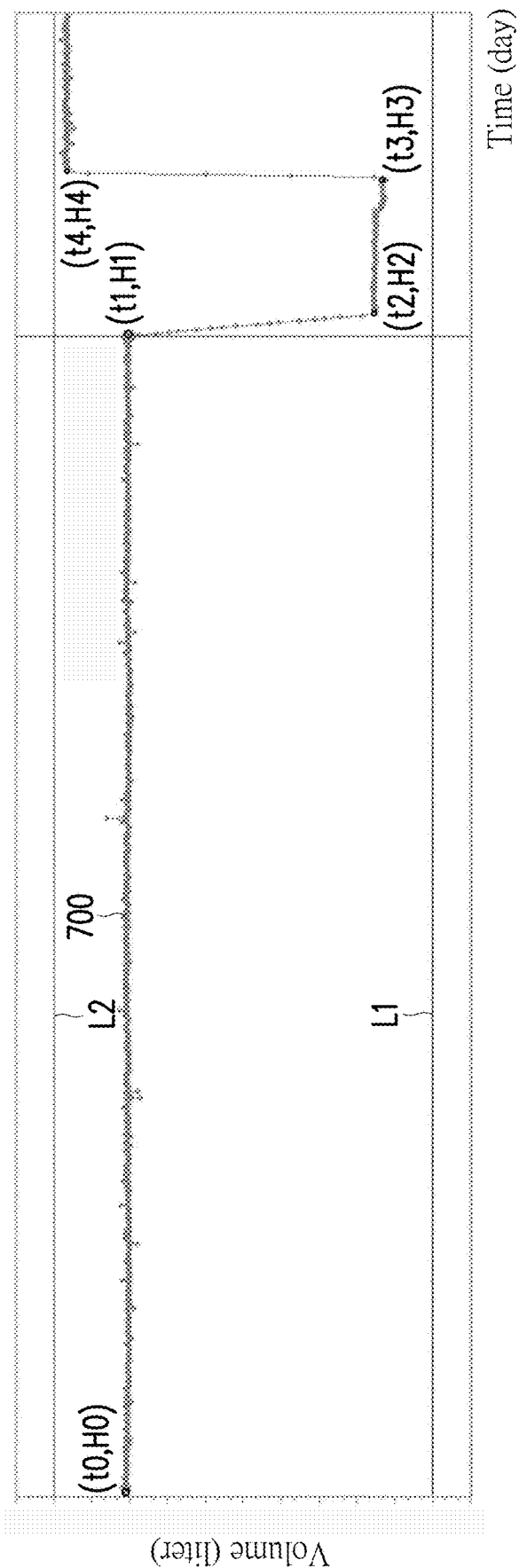
FIG. 7 illustrates another practical example of the change in liquid storage volume versus time in a liquid storage tank.

FIG. 7 illustrates another practical example of the change in liquid storage volume versus time in a liquid storage tank.

Referring to FIG. 7, a curve 700 shows the change in liquid storage volume as time passes. After a long period of time t1, the liquid level of the liquid in the liquid storage tank is maintained at H1. There is only a slight liquid drop as compared to the height H0 at the initial time t0. The liquid in the liquid storage tank should be volatile normally. However, within a short period of time (from time t1 to time t2), the liquid storage volume in the liquid storage tank drops sharply, causing the liquid level to suddenly drop to H2. Although the height of the liquid level H2 is still between the upper limit value L2 and the lower limit value L1, the drop in the height of the liquid level is too large in a very short period of time. Such liquid drop far exceeds the normal situation, indicating that there is a liquid leakage in the liquid storage tank. At this time, the controller can send a notification signal in time to notify the operator to check for leakage. The supply of the liquid is stopped and the problem is fixed. After a period of observation, the liquid level is maintained at H3 at time t3, which is not much different from the liquid level H2, indicating that the leakage has been improved. In this way, liquid replenishment can be performed at time t3 to increase the liquid level to H4 at time t4.

To sum up, the embodiment of the present disclosure uses a simple hydraulic pressure gauge to monitor the liquid consumption. Since the hydraulic pressure gauge is relatively cheap, the embodiments of the present disclosure can monitor whether the system has a fluid leakage in an economic and effective manner.

Although the present disclosure has been disclosed above with the embodiments, it is not intended to limit the present disclosure. Anyone with ordinary knowledge in the technical field may make some changes and modifications without departing from the spirit and scope of the present disclosure. The scope of protection of the present disclosure should be defined by the scope of the appended patent application.

What is claimed is:

1. A lithography system, comprising:
   an immersion lithographic apparatus;
   a fluid supply device configured to supply liquid to the immersion lithographic apparatus, and comprising at least one liquid storage tank, an upper liquid pipe and a lower liquid pipe connected to the liquid storage tank; and
   a sensor comprising at least one hydraulic pressure gauge, wherein the at least one hydraulic pressure gauge is arranged near a lower part of the liquid storage tank, connected to the lower liquid pipe and the upper liquid pipe, and configured to measure a hydraulic pressure at a bottom of the liquid storage tank,
   wherein a height of a liquid level of the liquid storage tank is calculated from the hydraulic pressure.

2. The lithography system according to claim 1, wherein the at least one hydraulic pressure gauge comprises a micro-pressure hydraulic gauge.

3. The lithography system according to claim 1, wherein the liquid comprises water.

4. The lithography system according to claim 1, further comprising a controller configured to receive the hydraulic pressure measured by the hydraulic pressure gauge so as to calculate the height of the liquid level.

5. The lithography system according to claim 4, wherein the controller sends a notification signal when the height of the liquid level is lower than a predetermined value.

6. The lithography system according to claim 4, wherein the controller sends a notification signal when the height of the liquid level is lower than a predetermined value within a predetermined time.

7. The lithography system according to claim 4, further comprising stopping supplying the liquid to the liquid storage tank.

8. The lithography system according to claim 1, wherein the fluid supply device comprises:
   a lens liquid storage tank configured to supply liquid between a wafer and a lens;
   a motor fluid storage tank configured to supply fluid to a motor; and
   a clean dry air storage tank configured to supply dry air to the wafer.

9. The lithography system according to claim 8, wherein the at least one hydraulic pressure gauge comprises:
   a first hydraulic pressure gauge configured to measure a hydraulic pressure at a bottom of the lens liquid storage tank; and
   a second hydraulic pressure gauge configured to measure a hydraulic pressure at a bottom of the motor fluid storage tank.

10. A method for detecting liquid leakage in a liquid storage tank of a lithography system, wherein the lithography system comprises:
    an immersion lithographic apparatus;
    a fluid supply device configured to supply liquid to the immersion lithographic apparatus, and comprising at least one liquid storage tank, an upper liquid pipe and a lower liquid pipe connected to the liquid storage tank; and
    a sensor comprising at least one hydraulic pressure gauge, wherein the at least one hydraulic pressure gauge is arranged near a lower part of the liquid storage tank, and connected to the lower liquid pipe and the upper liquid pipe,
    wherein the method comprises:
    measuring a hydraulic pressure at a bottom of the liquid storage tank of the liquid supply device with the hydraulic pressure gauge, wherein the liquid supply device is configured to supply liquid to the immersion lithographic apparatus; and
    calculating a height of a liquid level from the hydraulic pressure at the bottom of the liquid storage tank.

11. The method according to claim 10, further comprising:
    calculating the height of the liquid level with a controller of the lithography system.

12. The method according to claim 11, wherein the controller sends a notification signal when the height of the liquid level is lower than a predetermined value.

13. The method according to claim 11, further comprising:
   setting an amount of liquid drop per unit time as a critical value, wherein the controller sends a notification signal when the critical value is exceeded.

14. The method according to claim 11, further comprising stopping supplying the liquid to the liquid storage tank.

* * * * *